(12) United States Patent
Marple et al.

(10) Patent No.: US 6,429,659 B1
(45) Date of Patent: Aug. 6, 2002

(54) CONNECTION TESTER FOR AN ELECTRONIC TRIP UNIT

(75) Inventors: James Arthur Marple, Newtown, CT (US); Michael Roger Koller, Columbia City, IN (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/521,493

(22) Filed: Mar. 9, 2000

(51) Int. Cl.[7] ............... G01R 31/02; G01N 27/42; H02H 3/00
(52) U.S. Cl. ............... 324/424; 324/415; 361/6; 361/92
(58) Field of Search .................. 324/415–425; 321/230, 6, 92, 101, 102, 114

(56) References Cited

U.S. PATENT DOCUMENTS

| | | | |
|---|---|---|---|
| 2,340,682 A | 2/1944 | Powell | 200/147 |
| 2,719,203 A | 9/1955 | Gelzheiser et al. | 200/144 |
| 2,937,254 A | 5/1960 | Ericson | 200/114 |
| 3,158,717 A | 11/1964 | Jencks et al. | 200/116 |
| 3,162,739 A | 12/1964 | Klein et al. | 200/88 |
| 3,197,582 A | 7/1965 | Norden | 200/50 |
| 3,307,002 A | 2/1967 | Cooper | 200/116 |
| 3,517,356 A | 6/1970 | Hanafusa | 335/16 |
| 3,604,976 A * | 9/1971 | Zajic | 315/191 |
| 3,631,369 A | 12/1971 | Menocal | 337/110 |
| 3,678,372 A * | 7/1972 | Elder | 323/342 |
| 3,803,455 A | 4/1974 | Willard | 317/33 SC |
| 3,867,686 A * | 2/1975 | St-Jean | 324/424 |
| 3,883,781 A | 5/1975 | Cotton | 317/14 R |
| 4,129,762 A | 12/1978 | Bruchet | 200/153 G |
| 4,144,513 A | 3/1979 | Shafer et al. | 335/46 |
| 4,157,496 A * | 6/1979 | St-Jean | 324/415 |
| 4,158,119 A | 6/1979 | Krakik | 200/240 |
| 4,165,453 A | 8/1979 | Hennemann | 200/153 G |
| 4,166,988 A | 9/1979 | Ciarcia et al. | 335/9 |
| 4,220,934 A | 9/1980 | Wafer et al. | 335/16 |
| 4,255,732 A | 3/1981 | Wafer et al. | 335/16 |
| 4,259,651 A | 3/1981 | Yamat | 335/16 |
| 4,263,492 A | 4/1981 | Maier et al. | 200/288 |
| 4,276,527 A | 6/1981 | Gerbert-Gaillard et al. | 335/39 |
| 4,297,663 A | 10/1981 | Seymour et al. | 335/20 |
| 4,301,342 A | 11/1981 | Castonguay et al. | 200/153 SC |
| 4,360,852 A | 11/1982 | Gilmore | 361/98 |
| 4,368,444 A | 1/1983 | Preuss et al. | 335/166 |
| 4,375,021 A | 2/1983 | Pardini et al. | 200/147 B |
| 4,375,022 A | 2/1983 | Daussin et al. | 200/148 R |
| 4,376,270 A | 3/1983 | Staffen | 335/21 |
| 4,383,146 A | 5/1983 | Bur | 200/17 R |
| 4,392,036 A | 7/1983 | Troebel et al. | 200/322 |

(List continued on next page.)

FOREIGN PATENT DOCUMENTS

| | | |
|---|---|---|
| BE | 819 008 A | 12/1974 |
| BE | 897 691 A | 1/1984 |
| DE | 12 27 978 | 11/1966 |

(List continued on next page.)

*Primary Examiner*—N. Le
*Assistant Examiner*—Wasseem H. Hamdan
(74) *Attorney, Agent, or Firm*—Cantor Colburn LLP

(57) ABSTRACT

A trip unit connection tester (10) is arranged to test the electrical connections (12) and (14) between a trip unit (16) and actuator (18) mounted within a circuit breaker (20). Tester (10) includes a power source (64) including a positive lead (68), and a negative lead (70). The positive lead (68) is coupled to a two-loop switch (58). The two loop switch (58) toggles between a first loop (98), and a second loop (100). The first loop (98) includes the power source (64), the two-loop switch (58), and the energy storage element (82) wherein the energy storage element (82) stores energy coming from the power source (64). The second loop (100) includes the two-loop switch (58), and the energy storage element (82), connections (12) and (14), and the actuator (18), wherein energy stored within the energy storage element (82) is released to the actuator (18).

16 Claims, 3 Drawing Sheets

U.S. PATENT DOCUMENTS

| | | | |
|---|---|---|---|
| 4,393,283 A | 7/1983 | Masuda | 200/51.09 |
| 4,401,872 A | 8/1983 | Boichot-Castagne et al. | 200/153 G |
| 4,409,573 A | 10/1983 | DiMarco et al. | 335/16 |
| 4,435,690 A | 3/1984 | Link et al. | 335/37 |
| 4,467,297 A | 8/1984 | Boichot-Castagne et al. | 335/8 |
| 4,468,645 A | 8/1984 | Gerbert-Gaillard et al. | 335/42 |
| 4,470,027 A | 9/1984 | Link et al. | 335/16 |
| 4,479,143 A | 10/1984 | Watanabe et al. | 358/44 |
| 4,488,133 A | 12/1984 | McClellan et al. | 335/16 |
| 4,492,941 A | 1/1985 | Nagel | 335/13 |
| 4,541,032 A | 9/1985 | Schwab | 361/331 |
| 4,546,224 A | 10/1985 | Mostosi | 200/153 G |
| 4,550,360 A | 10/1985 | Dougherty | 361/93 |
| 4,562,419 A | 12/1985 | Preuss et al. | 335/195 |
| 4,589,052 A | 5/1986 | Dougherty | 361/94 |
| 4,595,812 A | 6/1986 | Tamaru et al. | 200/307 |
| 4,611,187 A | 9/1986 | Banfi | 335/16 |
| 4,612,430 A | 9/1986 | Sloan et al. | 200/327 |
| 4,616,198 A | 10/1986 | Pardimi | 335/16 |
| 4,622,444 A | 11/1986 | Kandatsun et al. | 200/303 |
| 4,631,625 A | 12/1986 | Alexander et al. | 361/94 |
| 4,642,431 A | 2/1987 | Tedesco et al. | 200/153 G |
| 4,644,438 A | 2/1987 | Puccinelli et al. | 361/75 |
| 4,649,247 A | 3/1987 | Preuss et al. | 200/244 |
| 4,658,322 A | 4/1987 | Rivera | 361/37 |
| 4,672,501 A | 6/1987 | Bilac et al. | 361/96 |
| 4,675,481 A | 6/1987 | Markowski et al. | 200/144 R |
| 4,682,264 A | 7/1987 | Demeyer | 361/96 |
| 4,689,712 A | 8/1987 | Demeyer | 361/96 |
| 4,694,373 A | 9/1987 | Demeyer | 361/96 |
| 4,710,845 A | 12/1987 | Demeyer | 361/96 |
| 4,717,985 A | 1/1988 | Demeyer | 361/96 |
| 4,733,211 A | 3/1988 | Castonguay et al. | 335/192 |
| 4,733,321 A | 3/1988 | Lindeperg | 361/96 |
| 4,764,650 A | 8/1988 | Bur et al. | 200/153 G |
| 4,768,007 A | 8/1988 | Mertz et al. | 335/202 |
| 4,780,786 A | 10/1988 | Weynachter et al. | 361/87 |
| 4,803,434 A * | 2/1989 | Walker | 324/424 |
| 4,831,221 A | 5/1989 | Yu et al. | 200/553 |
| 4,833,563 A | 5/1989 | Russell | 361/92 |
| 4,870,531 A | 9/1989 | Danek | 361/93 |
| 4,883,931 A | 11/1989 | Batteux et al. | 200/148 R |
| 4,884,047 A | 11/1989 | Baginski et al. | 335/10 |
| 4,884,164 A | 11/1989 | Dziura et al. | 361/97 |
| 4,900,882 A | 2/1990 | Bernard et al. | 200/147 R |
| 4,910,485 A | 3/1990 | Bolongeat-Mobleu et al. | 335/195 |
| 4,914,541 A | 4/1990 | Tripodi | 361/94 |
| 4,916,420 A | 4/1990 | Bartolo et al. | 335/172 |
| 4,916,421 A | 4/1990 | Pardimi et al. | 335/185 |
| 4,926,282 A | 5/1990 | McGhie | 361/102 |
| 4,935,590 A | 6/1990 | Malkin et al. | 200/148 A |
| 4,935,839 A * | 6/1990 | Lockwood | 361/230 |
| 4,937,706 A | 6/1990 | Schueller et al. | 361/396 |
| 4,939,492 A | 7/1990 | Ras et al. | 335/42 |
| 4,943,691 A | 7/1990 | Mertz et al. | 200/151 |
| 4,943,888 A | 7/1990 | Jacob et al. | 361/96 |
| 4,950,855 A | 8/1990 | Bolonegeat-Mobleu et al. | 200/148 A |
| 4,951,019 A | 8/1990 | Gula | 335/166 |
| 4,952,897 A | 8/1990 | Barnel et al. | 335/147 |
| 4,958,135 A | 9/1990 | Baginski et al. | 335/8 |
| 4,965,543 A | 10/1990 | Batteux | 335/174 |
| 4,983,788 A | 1/1991 | Pardimi | 200/16 R |
| 5,001,313 A | 3/1991 | Leclerq et al. | 200/148 B |
| 5,004,878 A | 4/1991 | Seymour et al. | 200/144 R |
| 5,029,301 A | 7/1991 | Nebon et al. | 335/16 |
| 5,030,804 A | 7/1991 | Abri | 200/323 |
| 5,057,655 A | 10/1991 | Kerusan et al. | 200/148 B |
| 5,065,101 A * | 11/1991 | Ledbetter | 324/418 |
| 5,077,627 A | 12/1991 | Fraise | 361/93 |
| 5,083,081 A | 1/1992 | Barrault et al. | 324/126 |
| 5,095,183 A | 3/1992 | Raphard et al. | 200/148 A |
| 5,103,198 A | 4/1992 | Morel et al. | 335/6 |
| 5,115,371 A | 5/1992 | Tripodi | 361/106 |
| 5,120,921 A | 6/1992 | DiMarco et al. | 200/401 |
| 5,132,865 A * | 7/1992 | Mertz et al. | 361/6 |
| 5,138,121 A | 8/1992 | Streich et al. | 200/293 |
| 5,140,115 A | 8/1992 | Morris | 200/308 |
| 5,153,802 A | 10/1992 | Mertz et al. | 361/18 |
| 5,155,315 A | 10/1992 | Malkin et al. | 200/148 R |
| 5,166,483 A | 11/1992 | Kersusan et al. | 200/144 A |
| 5,172,087 A | 12/1992 | Castonguay et al. | 335/160 |
| 5,178,504 A | 1/1993 | Falchi | 411/553 |
| 5,184,717 A | 2/1993 | Chou et al. | 200/401 |
| 5,187,339 A | 2/1993 | Lissandrin | 200/148 F |
| 5,198,956 A | 3/1993 | Dvorak | 361/106 |
| 5,200,724 A | 4/1993 | Gula et al. | 335/166 |
| 5,210,385 A | 5/1993 | Morel et al. | 200/146 R |
| 5,239,150 A | 8/1993 | Bolongeat-Mobleu et al. | 200/148 R |
| 5,260,533 A | 11/1993 | Livesey et al. | 200/401 |
| 5,262,744 A | 11/1993 | Arnold et al. | 335/8 |
| 5,272,438 A * | 12/1993 | Stumme | 324/424 |
| 5,280,144 A | 1/1994 | Bolongeat-Mobleu et al. | 200/148 R |
| 5,281,776 A | 1/1994 | Morel et al. | 200/144 |
| 5,296,660 A | 3/1994 | Morel et al. | 200/146 R |
| 5,296,664 A | 3/1994 | Crookston et al. | 200/401 |
| 5,298,874 A | 3/1994 | Morel et al. | 335/8 |
| 5,300,907 A | 4/1994 | Nereau et al. | 335/172 |
| 5,310,971 A | 5/1994 | Vial et al. | 200/244 |
| 5,313,180 A | 5/1994 | Vial et al. | 335/16 |
| 5,317,471 A | 5/1994 | Izoard et al. | 361/105 |
| 5,331,500 A | 7/1994 | Corcoles et al. | 361/93 |
| 5,334,808 A | 8/1994 | Bur et al. | 200/50 |
| 5,341,191 A | 8/1994 | Crookston et al. | 335/16 |
| 5,347,096 A | 9/1994 | Bolongeat-Mobleu et al. | 200/18 B |
| 5,347,097 A | 9/1994 | Bolongeat-Mobleu et al. | 200/148 B |
| 5,350,892 A | 9/1994 | Rozier | 200/144 B |
| 5,357,066 A | 10/1994 | Morel et al. | 200/17 R |
| 5,357,068 A | 10/1994 | Rozier | 200/148 R |
| 5,357,394 A | 10/1994 | Piney | 361/72 |
| 5,361,052 A | 11/1994 | Ferullo et al. | 335/172 |
| 5,373,130 A | 12/1994 | Barrault et al. | 200/147 R |
| 5,379,013 A | 1/1995 | Coudert | 335/17 |
| 5,424,701 A | 6/1995 | Castonguary et al. | 335/172 |
| 5,438,176 A | 8/1995 | Bonnardel et al. | 200/400 |
| 5,440,088 A | 8/1995 | Coudert et al. | 200/303 |
| 5,449,871 A | 9/1995 | Batteux et sl. | 200/401 |
| 5,450,048 A | 9/1995 | Leger et al. | 335/132 |
| 5,451,729 A | 9/1995 | Onderka et al. | 200/18 |
| 5,457,295 A | 10/1995 | Tamibe et al. | 200/293 |
| 5,459,630 A * | 10/1995 | MacKenzie et al. | 361/45 |
| 5,467,069 A | 11/1995 | Payet-Burin et al. | 335/42 |
| 5,469,121 A | 11/1995 | Payet-Burin | 335/16 |
| 5,475,558 A | 12/1995 | Barjonnet et al. | 361/64 |
| 5,477,016 A | 12/1995 | Baginski et al. | 200/43.11 |
| 5,479,143 A | 12/1995 | Payet-Burin | 335/202 |
| 5,483,212 A | 1/1996 | Lankuttis et al. | 335/132 |
| 5,485,343 A | 1/1996 | Samtos et al. | 361/115 |
| D367,265 S | 2/1996 | Yamagata et al. | D13/160 |
| 5,493,083 A | 2/1996 | Olivier | 200/17 R |
| 5,504,284 A | 4/1996 | Lazareth et al. | 200/50 R |
| 5,504,290 A | 4/1996 | Baginski et al. | 200/401 |
| 5,510,761 A | 4/1996 | Boder et al. | 335/172 |
| 5,512,720 A | 4/1996 | Coudert et al. | 200/400 |
| 5,515,018 A | 5/1996 | DiMarco et al. | 335/16 |

| | | | | | | |
|---|---|---|---|---|---|---|
| 5,519,561 A | 5/1996 | Mrenna et al. ............. 361/105 | EP | 0 295 158 | 12/1988 | |
| 5,534,674 A | 7/1996 | Steffens ...................... 218/154 | EP | 0 309 923 | 4/1989 | |
| 5,534,832 A | 7/1996 | Duchemin et al. ............ 335/16 | EP | 0 313 106 | 4/1989 | |
| 5,534,835 A | 7/1996 | McColloch et al. ......... 335/172 | EP | 0 313 422 | 4/1989 | |
| 5,534,840 A | 7/1996 | Cuingnet ....................... 337/1 | EP | 0 314 540 | 5/1989 | |
| 5,539,168 A | 7/1996 | Linzenich ................... 200/303 | EP | 0 331 586 | 9/1989 | |
| 5,543,595 A | 8/1996 | Mader et al. ............... 200/401 | EP | 0 337 900 | 10/1989 | |
| 5,552,755 A | 9/1996 | Fello et al. ................... 335/18 | EP | 0 342 133 | 11/1989 | |
| 5,581,219 A | 12/1996 | Nozawa et al. ............. 335/132 | EP | 0 367 690 | 5/1990 | |
| 5,604,656 A | 2/1997 | Derrick et al. .............. 361/187 | EP | 0 371 887 | 6/1990 | |
| 5,608,367 A | 3/1997 | Zoller et al. ................ 335/132 | EP | 0 375 568 | 6/1990 | |
| 5,784,233 A | 7/1998 | Bastard et al. ................ 361/36 | EP | 0 394 144 | 10/1990 | |
| 5,825,643 A * | 10/1998 | Dvorak et al. ................ 700/12 | EP | 0 394 922 | 10/1990 | |
| 5,856,710 A * | 1/1999 | Baughman et al. ........ 307/10.1 | EP | 0 399 282 | 11/1990 | |

FOREIGN PATENT DOCUMENTS

| | | | | | |
|---|---|---|---|---|---|
| DE | 30 47 360 | 6/1982 | EP | 0 407 310 | 1/1991 |
| DE | 38 02 184 | 8/1989 | EP | 0 452 230 | 10/1991 |
| DE | 38 43 277 | 6/1990 | EP | 0 555 158 | 8/1993 |
| DE | 44 19 240 | 1/1995 | EP | 0 560 697 | 9/1993 |
| EP | 29 41 505 A | 4/1981 | EP | 0 567 416 | 10/1993 |
| EP | 0 061 092 | 9/1982 | EP | 0 595 730 | 5/1994 |
| EP | 0 064 906 | 11/1982 | EP | 0 619 591 | 10/1994 |
| EP | 0 066 486 | 12/1982 | EP | 0 665 569 | 8/1995 |
| EP | 0 073 719 | 4/1983 | EP | 0 700 140 | 3/1996 |
| EP | 0 117 094 | 8/1984 | EP | 0 889 498 | 1/1999 |
| EP | 0 140 761 | 5/1985 | FR | 2 410 353 | 6/1979 |
| EP | 0 174 904 | 3/1986 | FR | 2 512 582 | 3/1983 |
| EP | 0 196 241 | 10/1986 | FR | 2 553 943 | 4/1985 |
| EP | 0 224 396 | 6/1987 | FR | 2 592 998 | 7/1987 |
| EP | 0 235 479 | 9/1987 | FR | 2 685 531 | 4/1993 |
| EP | 0 239 460 | 9/1987 | FR | 2 697 670 | 5/1994 |
| EP | 0 258 090 | 3/1988 | FR | 2 699 324 | 6/1994 |
| EP | 0 264 313 | 4/1988 | FR | 2 714 771 | 7/1995 |
| EP | 0 264 314 | 4/1988 | GB | 2 233 155 | 1/1991 |
| EP | 0 283 189 | 9/1988 | SU | 1 227 978 | 4/1986 |
| EP | 0 283 358 | 9/1988 | WO | 92/00598 | 1/1992 |
| EP | 0 291 374 | 11/1988 | WO | 92/05649 | 4/1992 |
| EP | 0 295 155 | 12/1988 | WO | 94/00901 | 1/1994 |

* cited by examiner

CONNECTION TESTER FOR AN ELECTRONIC TRIP UNIT

BACKGROUND OF THE INVENTION

The present invention generally relates to a tester for electronic trip units. More specifically, the present invention relates to a tester for suitably testing the connection between a trip unit and an actuator within a circuit breaker.

A circuit breaker typically includes a pair of electrical contacts that, when closed, allows circuit current to pass to a protected portion of an electrical distribution circuit via the closed contacts. When the contacts open, circuit current is prevented from flowing from one contact member to the other, and therefore, circuit current is prevented from flowing to the protected portion of the distribution circuit. The use of electronic trip units (trip units) in such circuit breakers is well known.

An electronic trip unit typically comprises voltage and current sensors, which provide analog signals indicative of the current flowing through the circuit breaker to a protected portion of an electrical distribution circuit. The analog signals are converted by an A/D (analog/digital) converter to digital signals, which are processed by a microcontroller. The trip unit further includes RAM (random access memory), ROM (read only memory) and EEPROM (electronic erasable programmable read only memory) all of which interface with the microcontroller. The ROM includes trip unit application code, e.g., main functionality firmware, including initializing parameters, and boot code. The EEPROM includes operational parameters for the application code.

In response to an overcurrent condition in the electrical distribution circuit, the electronic trip unit generates a trip signal, which is provided to an actuator within the circuit breaker. In response to the trip signal, the actuator, which includes a solenoid or similar electromechanical device, mechanically actuates (trips) an operating mechanism within the circuit breaker. The operating mechanism separates the electrical contacts to stop the flow of electrical current to the protected circuit.

The electronic trip unit and the actuator are typically separate components mounted within the circuit breaker's housing. Thus, when a circuit breaker is assembled, an electrical connection must be established between the electronic trip unit and the actuator. This connection is made within the circuit breaker housing and is, therefore, not visible when the circuit breaker housing is fully assembled. Operability of the circuit breaker depends upon the electrical connection between the trip unit and the actuator. Therefore, this connection must be checked during initial circuit breaker construction and periodically through the life of the circuit breaker. Unfortunately, a visual check can be made only by partially disassembling the circuit breaker, which increases construction and maintenance costs.

BRIEF SUMMERY OF THE INVENTION

It is therefore seen to be desirable to have a trip unit connection tester for testing the electrical connection between a trip unit and an actuator in a circuit breaker. The trip unit connection tester includes a power source and an energy storage element electrically connected to the power source. A two-loop switch is electrically connected to the power source and the energy storage element. The two-loop switch toggles between a first loop and a second loop. The first loop includes the power source and the energy storage element, and the second loop includes the energy storage element and the connection between the trip unit and the actuator.

BRIEF DESCRIPTION OF THE DRAWINGS

The present invention will now be described, by way of an example, with references to the accompanying drawings, in which.

DETAILED DESCRIPTION OF THE INVENTION

Figure 1:
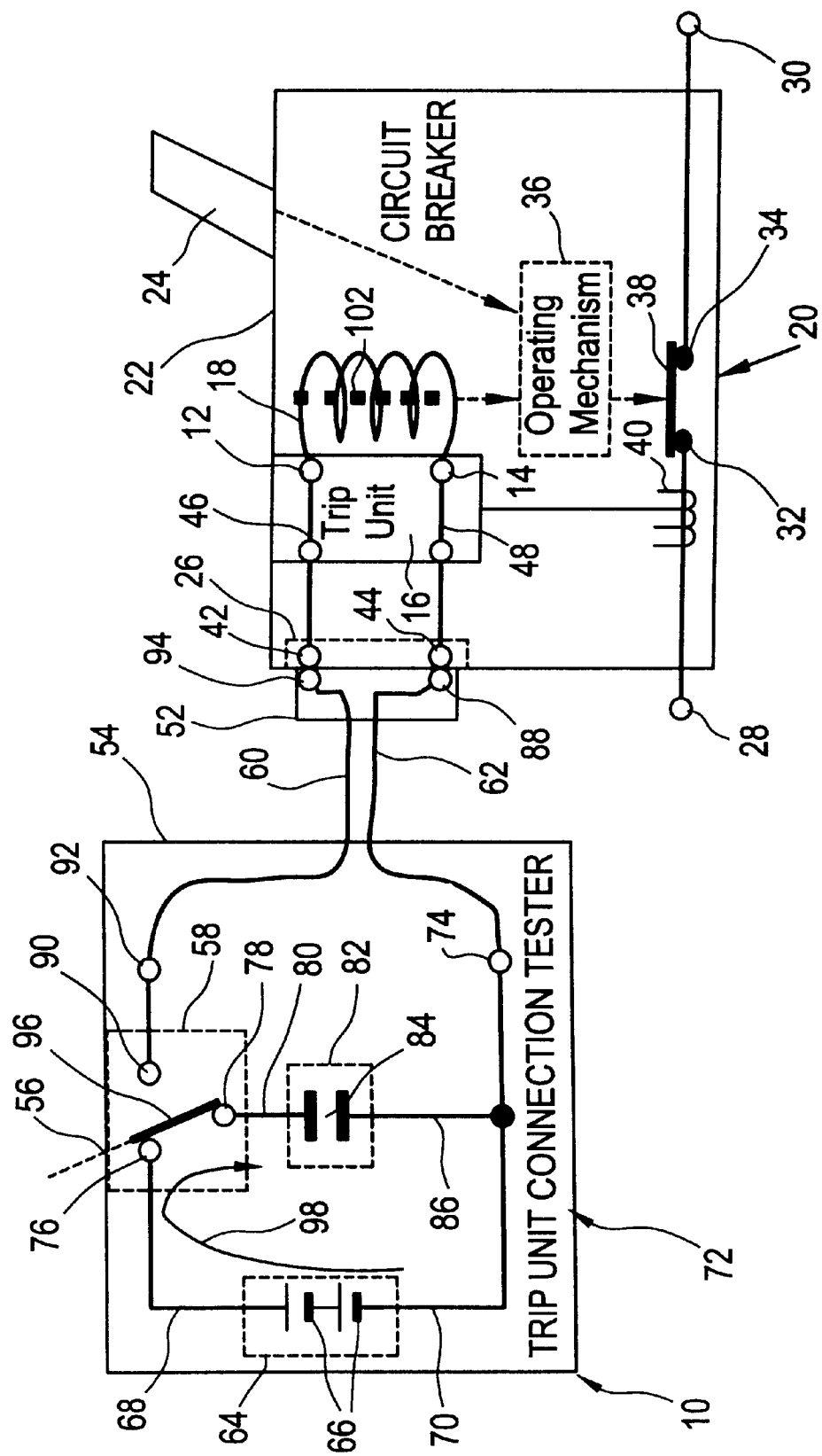
FIG. 1 is a schematic diagram showing the trip unit connection tester of the present invention in a charge position.

Referring to FIG. 1, a trip unit connection tester, generally shown at 10, is arranged to test the electrical connections 12 and 14 between a trip unit 16 and actuator 18 mounted within a circuit breaker 20.

Circuit breaker 20 includes an electrically insulative housing 22 with a handle 24 extending therefrom and a test jack recess 26 disposed therein. Circuit breaker 20 is configured to connect to an electrical distribution circuit (not shown) via terminals 28 and 30. Disposed on terminals 28 and 30, respectively, are stationary contacts 32 and 34, which are mounted within housing 22. Also mounted within housing 22 is an operating mechanism 36, which is operatively linked to a movable contact 38. Operating mechanism 36 is a mechanical linkage arranged to position movable contact 38 into electrical contact with stationary contacts 32 and 34 (i.e. close the contacts) to allow the flow of electrical current to a protected load (not shown) or a protected portion of the electrical distribution circuit (not shown).

Operating mechanism 36 is also arranged to position movable contact 38 out of electrical contact with stationary contacts 32 and 34 (i.e. open the contacts) to stop the flow of electrical current to a protected load (not shown) or a protected portion of the electrical distribution circuit (not shown). Handle 24 interacts with the operating mechanism 36 to allow the manual opening or closing of contacts 32, 34, and 38.

Electronic trip unit 16 is arranged within circuit breaker housing 22. Trip unit 16 receives a signal indicative of electrical current within terminal 28 via a current sensor 40, which is disposed proximate to terminal 28. If the current indicated by this signal is above a predetermined threshold, an overcurrent condition exists in the electrical distribution circuit. In response to such an overcurrent condition, trip unit 16 provides a trip signal to actuator 18 via connections 12 and 14. An example of such a trip unit is described in U.S. Pat. No. 4,589,052, which is incorporated herein by reference.

Actuator 18 is a solenoid or similar electromechanical device electrically connected to trip unit 16 at connections 12 and 14. Actuator 18 is arranged to activate operating mechanism 36 in response to receiving the trip signal from trip unit 16. Upon activation by actuator 18, operating mechanism opens contacts 32, 34, and 38 to stop the flow of electrical current to the protected load or the protected portion of the distribution circuit.

Test jack recess 26 is formed in housing 22 and includes jack terminals 42 and 44 mounted therein. Extending from jack terminal 42 is a conductive lead 46, which is electrically connected to connection 12. Extending from jack terminal 44 is a conductive lead 48, which is electrically connected to connection 14. Test jack 26 is configured to accept a test plug 52, which extends from the trip unit connection tester 10.

Trip unit connection tester 10 includes a hand-held casing 54 with test plug 52 and an operative portion 56 of a switch 58 extending therefrom. Test plug 52 is attached to casing 54 by insulated wires 60 and 62. Mounted within casing 54 is a power source 64 such as a battery 64 (e.g. a nine volt battery) or group of batteries 66 having a positive lead 68 and a negative lead 70. Power source 64 forms part of a test circuit 72 within casing 54.

In test circuit 72, the negative lead 70 of power source 64 is coupled to a common lead 74. The positive lead 68 is coupled to a first terminal 76 of the single pole double throw two-loop switch 58. A common terminal 78 of the single pole double throw two-loop switch 58 is coupled to a first end 80 of an energy storage element 82 such as a capacitor 84. A second end 86 of the energy storage element 82 is coupled to common lead 74. From the negative lead 70 and the second end 86 of the energy storage element 82 emerge the common lead 74 of the tester 10. Insulated wire 62 is attached to common lead 74. Insulated wire 62 extends external to tester housing 54 to a plug terminal 88 within plug 52. Plug terminal 88 is releasably engaged by jack terminal 44 to form an electrical connection therebetween. The single pole double throw two-loop switch 58 has a second terminal 90 that is connected to a second lead 92 of the tester 10. Insulated wire 60 is attached to second lead 92. Insulated wire 60 extends external to tester housing 54 to a plug terminal 94 within plug 52. Plug terminal 94 is releasably engaged by jack terminal 42 to form an electrical connection therebetween.

Figure 2:
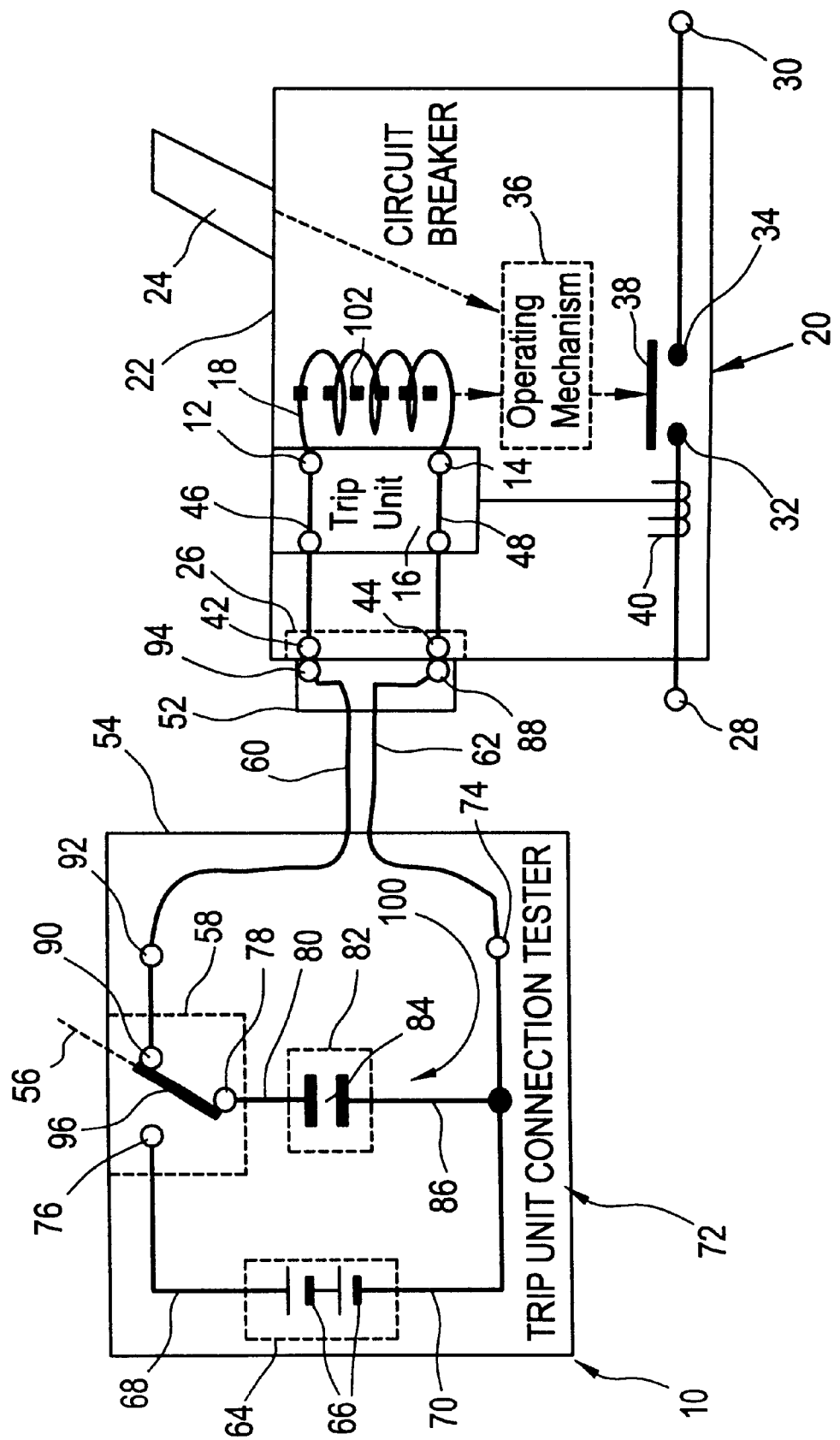
FIG. 2 is a schematic diagram showing the trip unit connection tester of FIG. 1 in a discharge position.

One operation of the tester 10 comprises two operational states. A first state (charge position) is shown in FIG. 1, wherein a contact 96 of the single pole double throw two loop switch 58 is in contact with the first terminal 76 and the common terminal 78. Thus, a first loop (circuit) 98 is formed whereby the power source 64 charges the energy storage element 82 within a specified time interval. The energy storage element 82 stays charged as long as the first loop 98 is closed. A second state (discharge position), shown in FIG. 2, is as follows. The contact 96 of the single pole double throw two-loop switch 58 is in contact with the second terminal 90 and the common terminal 78. Thus, a loop (circuit) 100 is formed comprising the energy storage element 82, the common terminal 74, the contact 96, the second terminal 90, the second lead 92, the terminals 94 and 42, lead 46 and connection 12. The loop 100 further comprises the actuator 18 having a first end coupled to the connection 12 and a second end coupled to connection 14. Connection 14 is coupled to lead 48. Lead 48 is connected to wire 62 via terminals 44 and 88. When the contact 96 flips over to that of the second terminal 90 the loop 100 is completed. The completed loop 100 causes the stored energy within the energy storage element 82 to release energy stored therein. The released energy flows through the actuator 18. If connections 12 and 14 between the trip unit 16 and the actuator 18 are properly established within the circuit breaker, the energy released by the energy storage element 82 will be received by the actuator 18. Actuator 18 will then cause movement of a solenoid element 102 contained within the actuator 18 and thereby activate the operating mechanism 36. The use of energy storage element 82 allows the passage of a sufficient amount of energy to test the actuator 18, while ensuring that the amount of energy provided will not damage the actuator 18 or any of the circuitry.

Trip unit connection tester 10 allows connections 12 and 14 to be tested without disassembling circuit breaker 20.

Testing is performed by inserting plug 52 into jack 26 so that a connection is established between terminals 42 and 94 and between terminals 44 and 88. The operative portion 56 of switch 58 is then moved to the discharge position (FIG. 2). If the breaker trips (i.e. contacts 32, 34, and 38 separate) then the connections 12 and 14 are good. If the breaker 20 does not trip, then the trip unit 16 and actuator 18 are not properly connected. Trip unit connection tester 10 provides a low cost, hand held tester that can be operated by a common power source 64. Because connections 12 and 14 can be tested without disassembling the circuit breaker 20, the trip unit connection tester 10 saves construction and maintenance costs.

Figure 3:
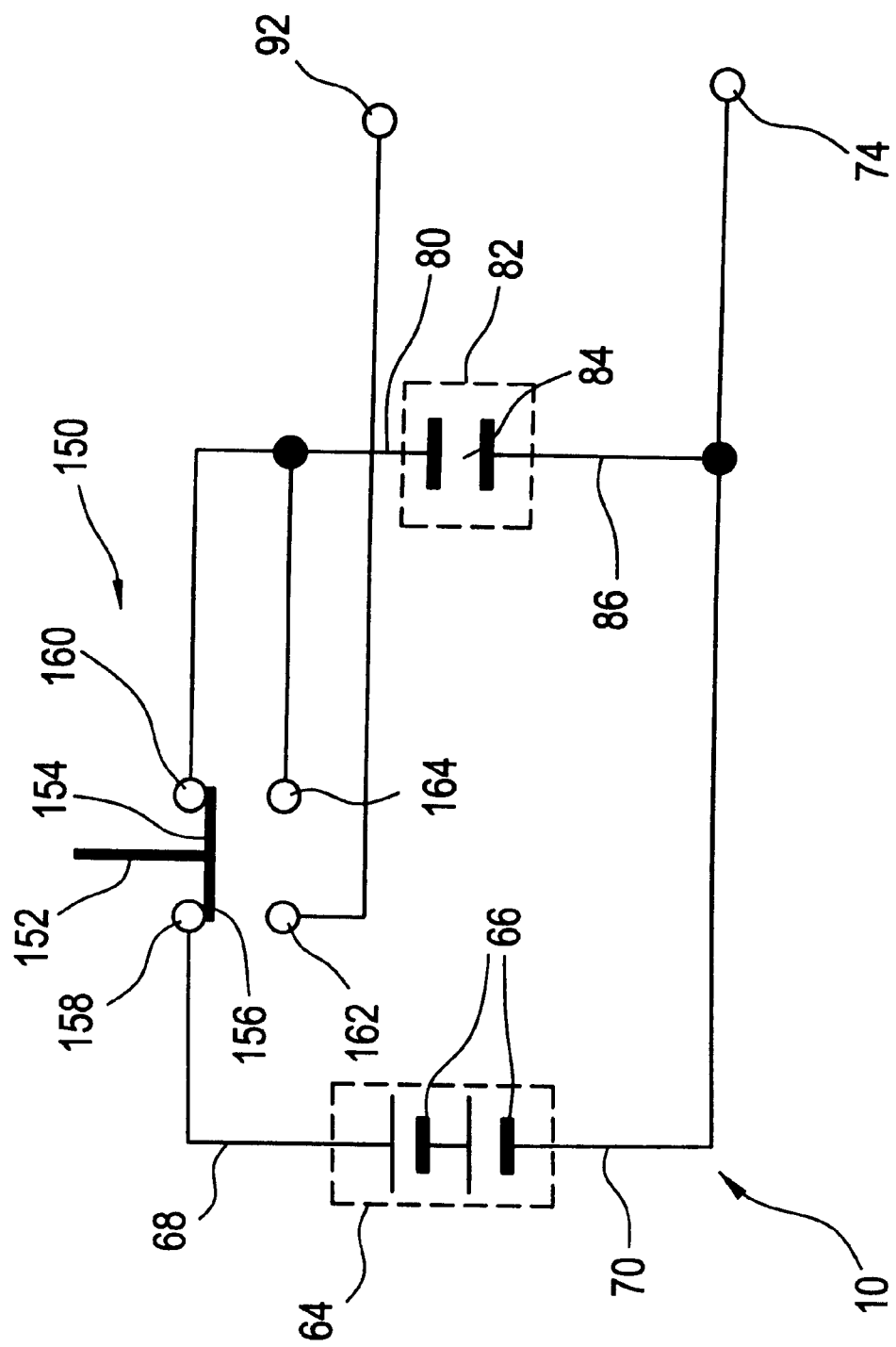
FIG. 3 is a schematic diagram showing an alternative embodiment of the trip unit connection tester of the present invention in a charge position.

Referring to FIG. 3, a second embodiment of the instant invention is described. More specifically, a second embodiment of the trip unit connection tester 10 is described where the single pole double throw two loop switch 58 is replaced with a plunger type switch 150. In this embodiment, a plunger 152 has two conducting surfaces, a first surface 154 and a second surface 156. In other words, a double make, double break contact on arm 152 is used as a contact for the instant invention. The contact has the first surface 154 and a second surface 156. The positive lead 68 of the power source 64 is coupled to a first terminal 158 having a first contact (not shown), and the first end 80 of an energy storage element 82 is coupled to a second terminal 160 having a second contact (also not shown). The double break contact on arm 152 can come in electric connection with the first and second contacts by way of having the first surface 154 in direct contact with the first and second contacts. Furthermore, the second end 86 of the energy storage element 82, and the negative lead 70 of the power source 64 are coupled together. In other words, the first loop 98 (FIG. 1) is closed when the double break contact on arm 152 can come in electric connection with the first and second contacts by way of having the first surface 154 in direct contact with the first and second contacts. The second lead 92 is coupled to a third terminal 162 having a third contact (not shown). The first end 80 of an energy storage element 82 is also coupled to a fourth terminal 164 having a fourth contact (also not shown). In addition, the negative lead 70 of the power source 64 and the second end 86 are coupled together, as well as coupled to the first lead 74 of the tester 10. The double break contact arm 152 can come in electric connection with the third and fourth contacts by way of having the second surface 156 in direct contact with the third and fourth contacts. In other words, the second loop 100 (FIG. 2) is closed when the double break contact on arm 152 can come in electric connection with the third and fourth contact by way of having the second surface 156 in direct contact with the third and fourth contacts.

Furthermore, it can be appreciated the instant invention further includes a method for trip unit actuator testing system, which includes charging an energy storage element 82, as well as releasing energy from the energy storage element 82 upon a load.

It will be understood that a person skilled in the art may make modifications to the preferred embodiment shown herein within the scope and intent of the claims. While the present invention has been described as carried out in a specific embodiment thereof, it is not intended to be limited thereby but intended to cover the invention broadly within the scope and spirit of the claims.

What is claimed is:

1. A trip unit connection tester for testing the electrical connection between a trip unit and an actuator in a circuit breaker, the trip unit connection tester comprising;

a casing;

a power source;

an energy storage element electrically connected to said power source, a two-loop switch electrically connected to said power source and said energy storage element, said two-loop switch toggles between a first loop and a second loop, said first loop includes said power source and said energy storage element, and said second loop includes said energy storage element and the connection between the trip unit and the actuator, the actuator coupled to the trip unit; and, a plug extending from the casing, the plug including a plug terminal secured therein, said plug terminal configured to releasably engage a jack terminal electrically connected to the tip unit, and wherein said second loop further includes said plug terminal and said jack terminal.

2. The trip unit connection tester of claim 1 wherein said casing is insulative, and further wherein said casing houses said power source, said energy storage element, and said two-loop switch therein; said trip unit further comprising:

an operative portion of said two-loop switch extending from said insulative casing, said operative portion for toggling said two-loop switch between said first loop and said second loop.

3. The trip unit connection tester of claim 1, wherein said jack terminal is secured within a test jack disposed in the breaker.

4. The trip unit connection tester of claim 1, wherein said two loop switch comprises a single pole double throw two loop switch.

5. The trip unit connection tester of claim 1, wherein said two-loop switch comprises a plunger type switch.

6. A trip unit actuator testing system comprising:

a trip unit;

an actuator electrically connected to said trip unit;

a jack terminal electrically connected to the trip unit;

a circuit breaker housing the trip unit and the actuator; and, a tester arranged to test an electrical connection between said trip unit and said actuator, said tester including a power source, an energy storage element electrically connected to said power source, a two-loop switch electrically connected to said power source and said energy storage element, said two-loop switch toggles between a fist loop and a second loop, said first loop includes said power source and said energy storage element, and said second loop includes said energy storage element and the connection between said trip unit and said actuator; and, a plug extending from the tester, the plug including a plug terminal secured therein, the plug terminal configured to releasably engage the jack terminal and wherein said second loop further includes the plug terminal and the jack terminal.

7. The trip unit actuator testing system of claim 6, wherein said actuator is arranged to move an electrical contact when said two-loop switch is toggled to said second loop.

8. The trip unit actuator testing system of claim 6, wherein: said power source comprises a set of batteries.

9. The trip unit actuator testing system of claim 6, wherein: said energy storage element comprises a capacitor.

10. The trip unit actuator testing system of claim 6, wherein: said two loop switch comprises a single pole double throw two loop switch.

11. The trip unit actuator testing system of claim 6, wherein the circuit breaker includes a housing, the housing including a test jack.

12. The trip unit actuator testing system of claim 11, wherein the jack terminal is electrically connected to the test jack.

13. The trip unit actuator testing system of claim 12 wherein the tester further includes a casing, said plug extending from said casing.

14. The trip unit actuator testing system of claim 12 wherein the plug is connected to the tester by insulated wire.

15. The trip unit actuator testing system of claim 11 wherein the test jack includes a pair of jack terminals, a first jack terminal connected to the electrical connection by a connecting lead.

16. The trip unit actuator testing system of claim 6 wherein the actuator includes a solenoid element.

* * * * *